(12) United States Patent
Huang

(10) Patent No.: US 11,829,759 B2
(45) Date of Patent: *Nov. 28, 2023

(54) APPARATUS AND METHOD FOR SEGMENTING A DATA STREAM OF A PHYSICAL LAYER

(71) Applicant: Silicon Motion, Inc., Zhubei (TW)

(72) Inventor: Han-Cheng Huang, Taipei (TW)

(73) Assignee: Silicon Motion, Inc., Zhubei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/858,398

(22) Filed: Jul. 6, 2022

(65) Prior Publication Data

US 2022/0350603 A1    Nov. 3, 2022

Related U.S. Application Data

(63) Continuation of application No. 16/892,686, filed on Jun. 4, 2020, now Pat. No. 11,422,813.

(30) Foreign Application Priority Data

Apr. 8, 2020  (CN) .......................... 202010267968.6

(51) Int. Cl.
   *G06F 9/30*  (2018.01)
   *G06F 13/14*  (2006.01)
   (Continued)

(52) U.S. Cl.
   CPC ........ *G06F 9/3013* (2013.01); *G06F 9/30021* (2013.01); *G06F 9/30087* (2013.01);
   (Continued)

(58) Field of Classification Search
   CPC .............. G06F 9/3013; G06F 9/30021; G06F 9/30087; G06F 9/30101; G06F 9/3859;
   (Continued)

(56) References Cited

U.S. PATENT DOCUMENTS 5,133,078 A * 7/1992 Minassian ................. G06F 5/16
                                                           710/60
6,188,702 B1   2/2001 Tornetta et al.
                 (Continued)

FOREIGN PATENT DOCUMENTS

CN          102609386 A        7/2012
CN          109902051 A        6/2019
                 (Continued)

*Primary Examiner* — Farley Abad
(74) *Attorney, Agent, or Firm* — Birch, Stewart, Kolasch & Birch, LLP

(57) ABSTRACT

The invention introduces an apparatus for segmenting a data stream, installed in a physical layer, to include a host interface, a data register and a boundary detector. The data register is arranged to operably store data received from the host side through the host interface. The boundary detector is arranged to operably detect the content of a data register. When the data register includes a special symbol, the boundary detector outputs a starting address that the special symbol is stored in the data register to an offset register to update a value stored in the offset register, thereby enabling a stream splitter to divide data bits of the data register according to the updated value of the offset register.

4 Claims, 11 Drawing Sheets

(51) Int. Cl.
*G11C 7/10* (2006.01)
*G06F 9/38* (2018.01)

(52) U.S. Cl.
CPC ...... *G06F 9/30101* (2013.01); *G06F 9/38585* (2023.08); *G06F 13/14* (2013.01); *G11C 7/10* (2013.01); *G11C 2207/107* (2013.01)

(58) Field of Classification Search
CPC .. G06F 13/14; G06F 12/0246; G06F 13/1668; G06F 13/4282; G06F 2213/0026; G06F 9/38585; G11C 7/10; G11C 2207/107; G11C 16/0483; G11C 7/1006; G11C 16/10; G11C 16/3427
See application file for complete search history.

(56) References Cited

U.S. PATENT DOCUMENTS

| | | | |
|---|---|---|---|
| 7,230,549 B1* | 6/2007 | Woodral | G06F 13/4217 341/100 |
| 10,592,450 B2 | 3/2020 | Huggins | |
| 2003/0152154 A1 | 8/2003 | Johnson | |
| 2003/0161429 A1 | 8/2003 | Chiang | |
| 2005/0201305 A1* | 9/2005 | Shibata | H04L 5/16 370/282 |
| 2005/0273641 A1* | 12/2005 | Sandven | H04J 3/0608 713/600 |
| 2012/0139593 A1 | 6/2012 | Saito | |
| 2012/0163490 A1* | 6/2012 | Whitby-Strevens | H04L 25/4908 375/285 |
| 2013/0329837 A1* | 12/2013 | Reyland, Jr. | H04L 1/0054 714/780 |
| 2016/0034025 A1* | 2/2016 | Dabral | G06F 1/3296 710/313 |
| 2016/0373198 A1* | 12/2016 | Natsukawa | H04L 69/03 |
| 2019/0179785 A1 | 6/2019 | Keeth et al. | |

FOREIGN PATENT DOCUMENTS

| | | |
|---|---|---|
| CN | 110781112 A | 2/2020 |
| EP | 2 728 491 A1 | 5/2014 |
| TW | I533210 B | 5/2016 |
| WO | WO 2016/160199 A1 | 10/2016 |

* cited by examiner

APPARATUS AND METHOD FOR SEGMENTING A DATA STREAM OF A PHYSICAL LAYER

CROSS-REFERENCE TO RELATED APPLICATIONS

This is a Continuation Patent Application of and claims the benefit of priority to U.S. patent application Ser. No. 16/892,686, filed on Jun. 4, 2020, which claims the benefit of priority to Patent Application No. 202010267968.6, filed in China on Apr. 8, 2020; the entirety of which is incorporated herein by reference for all purposes.

BACKGROUND

The disclosure generally relates to storage devices and, more particularly, to an apparatus and a method for segmenting a data stream of a physical layer.

Flash memory devices typically include NOR flash devices and NAND flash devices. NOR flash devices are random access—a host accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the host has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word.

To meet the requirements of high-speed communications, a physical layer of a flash memory device may include a Serializer/Deserializer (hereinafter referred to as SerDes). The SerDes is a pair of functional circuits to compensate for limited input/output. It provides data transmission over a single line or a differential pair in order to minimize the number of I/O pins and interconnects. These blocks convert data between serial interface and parallel interfaces in each direction. Specifically, a transmitter converts low-speed parallel signals into high-speed serial signals and transmits the converted ones to a receiver through a single wire or a differential pair. However, in the SerDes environment, a phase-locked loop (PLL) loses lock due to frequency differences or environmental factors, which causes unwanted bits to be inserted into raw data or certain bits of raw data to be lost. Thus, it is desirable to have an apparatus and a method for segmenting a data stream of a physical layer to address the aforementioned problems.

SUMMARY

In an aspect of the invention, an embodiment introduces an apparatus for segmenting a data stream, installed in a physical layer, to at least include a host interface, a data register and a boundary detector. The data register is arranged to operably store data received from the host side through the host interface. The boundary detector is arranged to operably detect the content of the data register. When the data register includes a special symbol, the boundary detector outputs a starting address that the special symbol is stored in the data register to an offset register to update a value stored in the offset register, thereby enabling a stream splitter to divide data bits of the data register according to the updated value of the offset register.

In another aspect of the invention, an embodiment introduces a method for segmenting a data stream, performed by a physical layer, at least including: comparing all possible sequences of consecutive n bits of data in a data register with a special symbol; and when any sequence of consecutive n bits of data in the register matches the special symbol, changing to divide the content of the data register to generate one or more segments according to a starting address that the special symbol is stored in the data register.

In still another aspect of the invention, an embodiment introduces a method for segmenting a data stream, performed by a physical layer, at least including: comparing all possible sequences of consecutive n bits of data in a data register with a special symbol when segmented data has been failed to decode; and changing to divide the content of the data register to generate one or more segments according to a starting address that the special symbol is stored in the data register when any sequence of consecutive n bits of data in the register matches the special symbol.

The special symbol is not originally used to determine boundaries of each segment.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
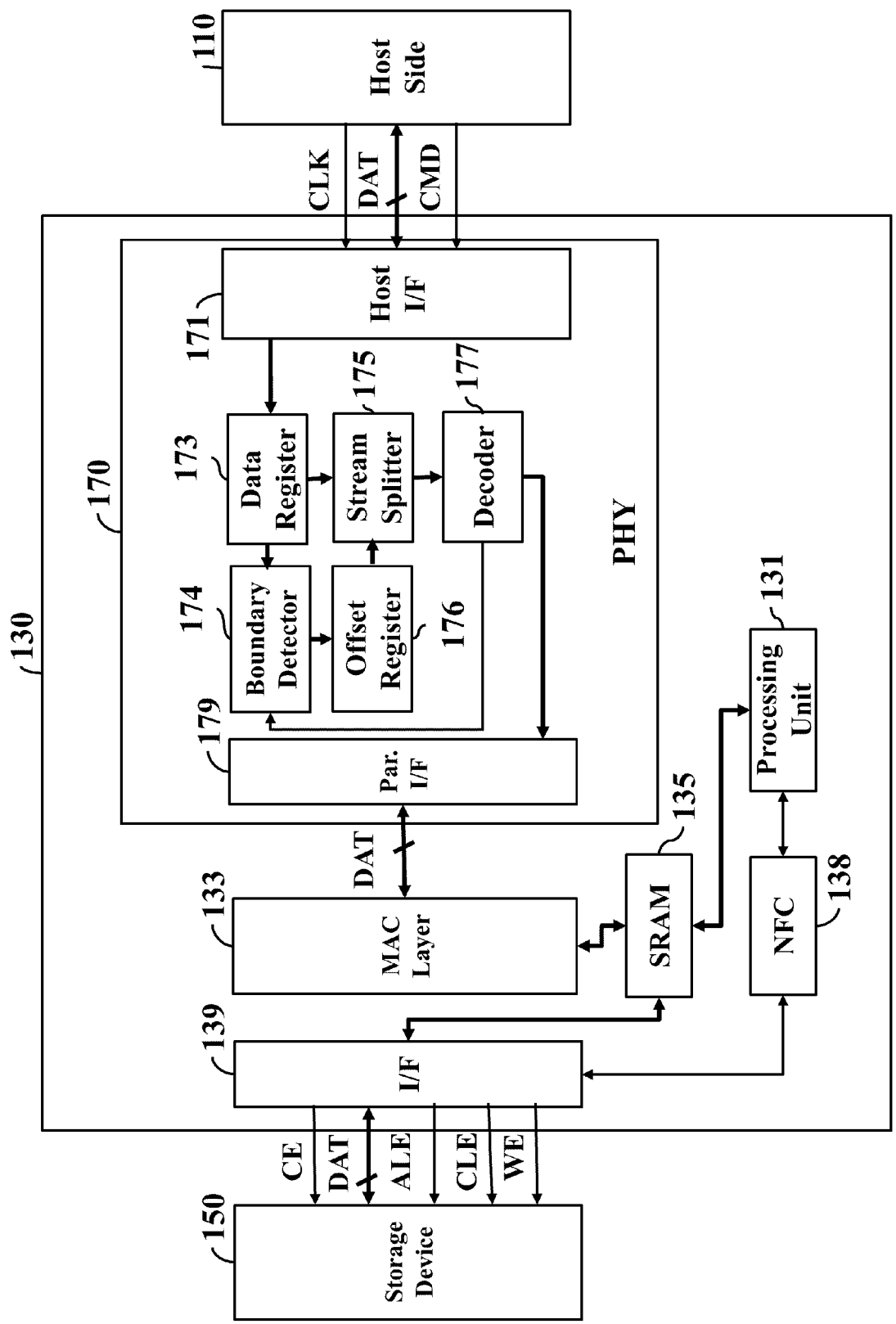
FIG. 1 is the flash system architecture according to an embodiment of the invention.

Refer to FIG. 1. The electronic apparatus 100 includes a host side 110, a controller 130 and a storage device 150, and the controller 130 and the storage device 150 may be collectively referred to as a device side. The electronic apparatus 100 may be equipped with a Personal Computer (PC), a laptop PC, a tablet PC, a mobile phone, a digital camera, a digital recorder, or other consumer electronic products. An interface (I/F) (not shown in FIG. 1) of the host side 110 and a host interface (I/F) 171 of a controller 130 may communicate with each other by Universal Serial Bus (USB), Advanced Technology Attachment (ATA), Serial Advanced Technology Attachment (SATA), Peripheral Component Interconnect Express (PCI-E) Embedded Multi-Media Card (eMMC) protocol, or others. A storage I/F 139 of the controller 130 and a flash I/F of the storage device 150 may communicate with each other by a Double Data Rate (DDR) protocol, such as Open NAND Flash Interface (ONFI), DDR Toggle, or others. The controller 130 includes a processing unit 131 receives host commands, such as read commands, write commands, erase commands, etc., through a physical layer (PHY) 170 and a Media Access Control (MAC) layer 133. The processing unit 131 may be implemented in numerous ways, such as with general-purpose hardware (e.g., a single processor, multiple processors or graphics processing units capable of parallel computations, or others) that is programmed using firmware and/or software instructions to perform the functions recited herein. The controller 130 includes a Static Random Access Memory (SRAM) 135 for allocating space as a data buffer storing user data that is to be programmed into a storage unit for host write commands and has been read from the storage unit for host read commands, and storing necessary data in execution, such as variables, data tables, data abstracts, host-to-flash (H2F) tables, flash-to-host (F2H) tables, or others. The controller 130 includes a NAND flash controller (NFC) 138 to provide functions that are required to access to the storage device 150, such as a command sequencer, a Low Density Parity Check (LDPC) encoder/decoder, etc. The processing unit 131 advises the storage device 150 to perform data reads, writes, erases operations, and so on, through the NFC 138 and the storage I/F 139.

The storage device 150 includes a storage unit 153 for providing huge storage space typically in hundred Gigabytes, or even several Terabytes, for storing a wide range of user data, such as high-resolution images, video files, etc. The storage unit 153 includes control circuits and memory arrays containing memory cells, such as Single Level Cells (SLCs), Multi-Level Cells (MLCs), Triple Level Cells (TLCs), Quad-Level Cells (QLCs), or any combinations thereof. The processing unit 131 programs user data into a designated address (a destination address) of the storage device 150 (specifically, the storage unit 153) and reads user data from a designated address (a source address) thereof through a storage I/F 139. The storage I/F 139 may use several electronic signals including data lines, a clock signal line and control signal lines for coordinating the command, address and data transfer between the controller 130 and the storage device 150. The data lines may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

Figure 2:
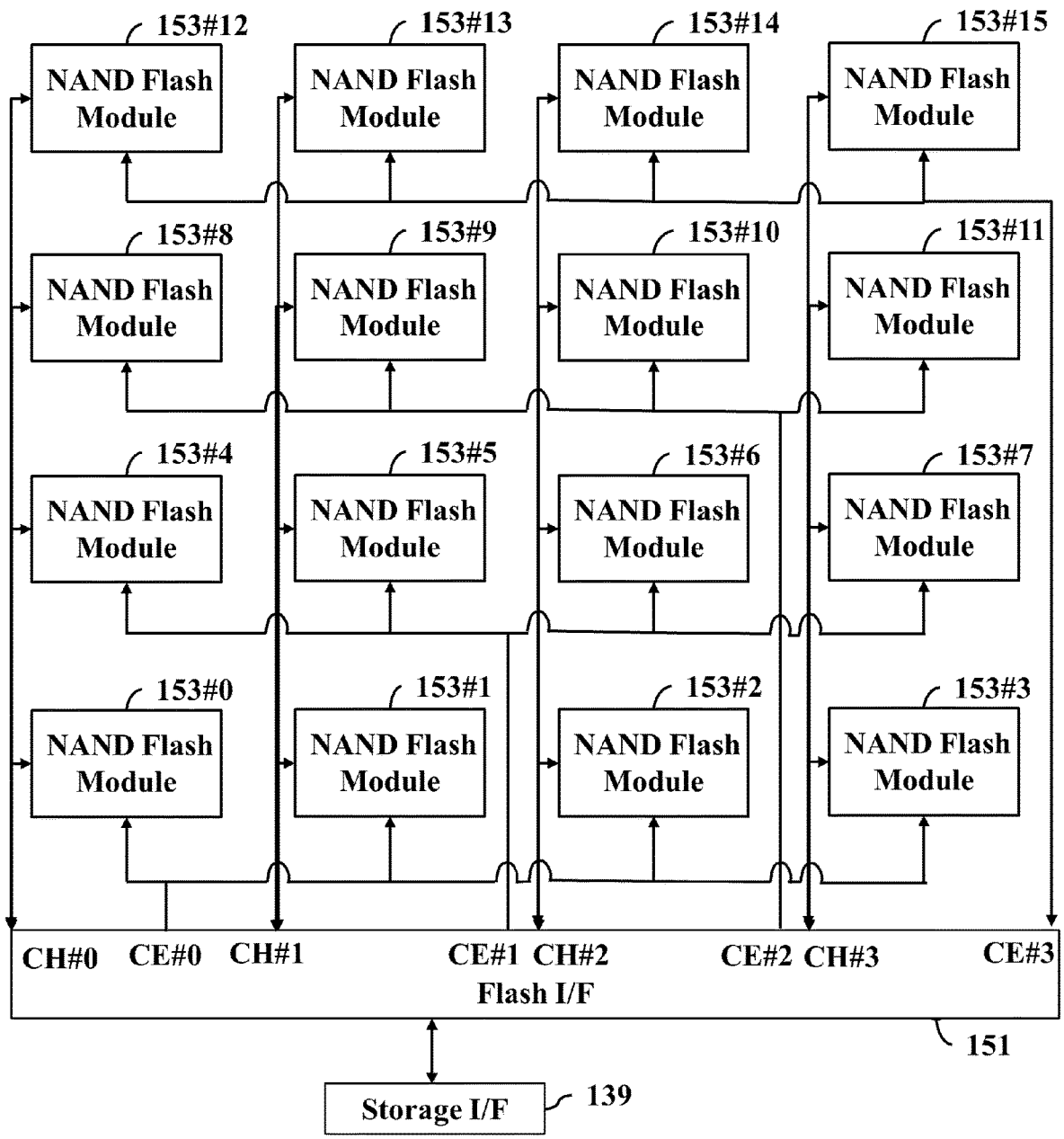
FIG. 2 is a schematic diagram illustrating Logical Unit Numbers (LUNs) connecting to a flash interface.

Refer to FIG. 2. A flash I/F 151 may include four I/O channels (hereinafter referred to as channels) CH #0 to CH #3 and each is connected to four NAND flash modules, for example, the channel CH #0 is connected to the NAND flash modules 153 #0, 153 #4, 153 #8 and 153 #12. Each NAND flash module can be packaged in an independent die. The NAND flash controller 138 may issue one of the CE signals CE #0 to CE #3 through the storage I/F 139 and the flash I/F 151 to activate the NAND flash modules 153 #0 to 153 #3, the NAND flash modules 153 #4 to 153 #7, the NAND flash modules 153 #8 to 153 #11, or the NAND flash modules 153 #12 to 153 #15, and read data from or program data into the activated NAND flash modules in parallel.

Figure 3A:
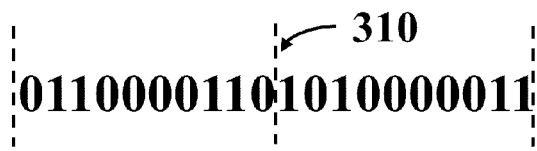
FIG. 3A is a schematic diagram showing an original data stream.
Figure 3B:
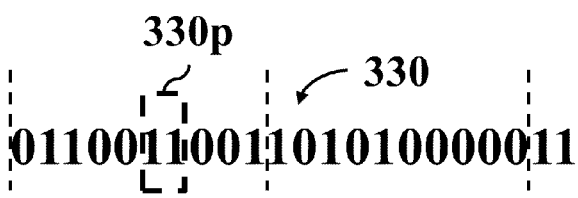
FIGS. 3B and 3C are schematic diagrams showing disturbed data streams.
Figure 3C:
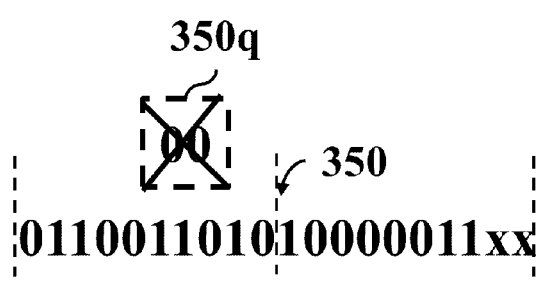

The PHY 170 of the controller 130 may be configured to the 8b/10b, 64b/66b or 128b/130b SerDes environment. However, a phase-locked loop (PLL) loses lock due to frequency differences or environmental factors, which causes unwanted bits to be inserted into raw data or certain bits of raw data to be lost, where the raw data is transmitted by the host side 110. The environmental interference is more serious when the controller 130 is installed in a mobile phone. For example, the surge generated when an user operating the touch screen affects the analog circuit of the PHY 170 (also called the analog physical layer, A-PHY), so that the PLL is unlocked more frequently. The A-PHY includes a serializer that maps each segment to a code represented by more bits before serializing data, such as mapping each 8-, 64-, and 128-bit of data to 10-, 66-, and 130-bit code, respectively. For example, refer to FIG. 3A. The host side 110 transmits data containing a data stream "b01100001101010000011" through the host I/F 171 to the PHY 170 of the controller 130. However, when the PLL losses lock, the PHY 170 receives wrong data 330 as shown in FIG. 3B or wrong data 350 as shown in FIG. 3C. The data stream 330 as shown in FIG. 3B contains bits "b11" 330p that are not presented in the raw data 310. The data stream 350 as shown in FIG. 3C losses bits "b00" 350q of the raw data 310. Since the original data stream is composed of a series of fixed-length segments, such as 10-, 66-, 130-bit of data, etc., the mistakenly inserted bits or the lost bits would cause errors in the subsequent data splits. For example, the original data stream 310 should be split into two 10-bit segments "b0110000110" and "b1010000011" perfectly. However, the erroneous data stream 330 is split into two wrong 10-bit segments"b0110011001" and "b1010100000". The erroneous data stream 350 is split into two wrong 10-bit segments "b0110011010" and "b10000011xx".

To address the split errors caused by the PLL unlock described above, in some implementations of the 8b/10b SerDes environment, the host side 110 periodically transmits a boundary-lock pattern, such as the UFS Head of Bursts (HOB, also called MK0 or K.28.5 symbol), etc., so that the PHY 170 can re-determine the boundaries of each segment to split by tracking the boundary-lock pattern carried in the data stream received from the host I/F 171. In some implementations of the 128b/130b SerDes environment, the host side 110 periodically transmits a boundary-lock pattern, such as the PCI-E comma character (also called K28.5 symbol), etc., so that the PHY 170 can re-determine the boundaries of each segment and accordingly split it. However, to achieve a better transmission rate, the host side 110 may reduce the transmission times of the boundary-lock pattern to lengthen the time for correcting the data split errors by the PHY 170.

Figure 4:
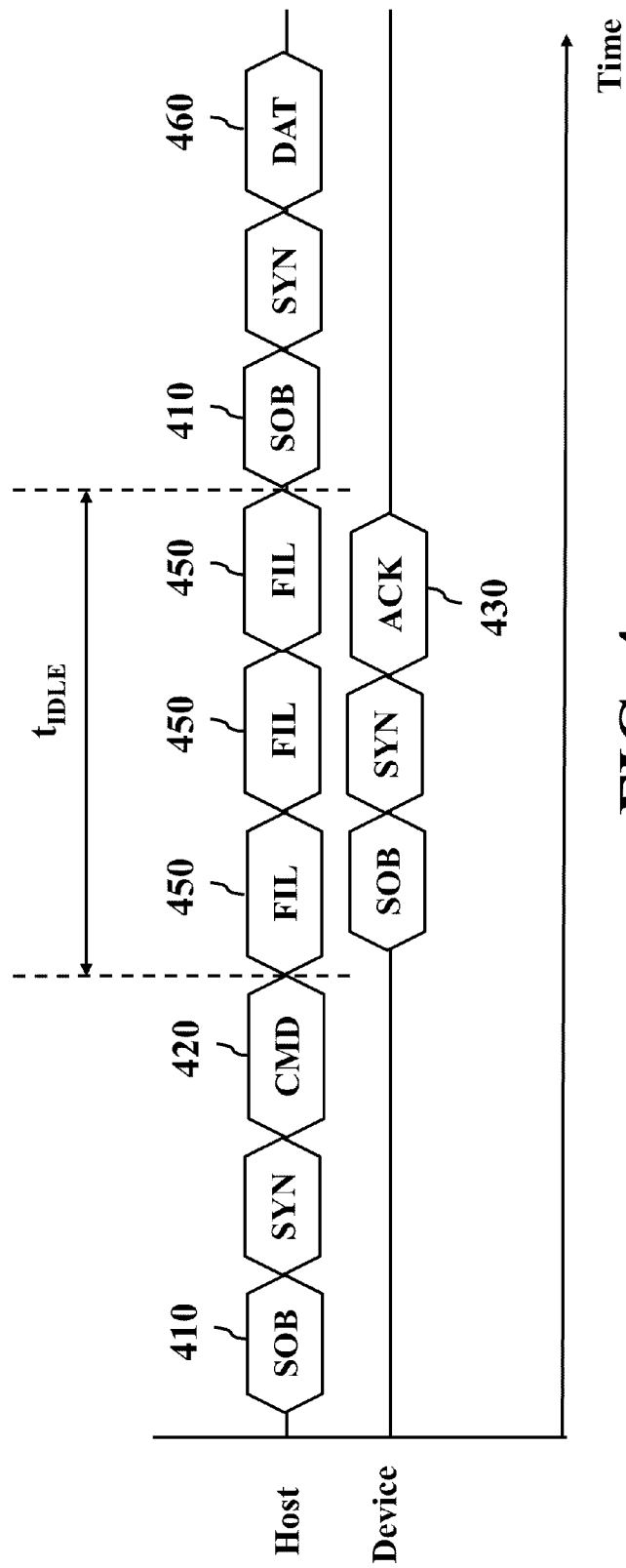
FIG. 4 illustrates a sequence diagram for writing user data by a host side.

To improve the shortcoming of the implementations described above, in the 8b/10b SerDes environment, an embodiment of the invention introduces PHY circuits for not only tracking the boundary-lock pattern within the data stream received from the host I/F 171 during valid-packet transmission periods in time but also tracking a special symbol, such as the UFS FILLER (also called K.28.1 symbol), within the data stream received from the host I/F 171 during idle periods in time. Refer to FIG. 4 showing an example that the host side 110 writes user data. In regular situations, the host side 110 sends a host write command "CMD" 420 after transmitting a start of burst (SOB) 410 that is utilized by the controller 130 to split a data stream correctly. Subsequently, the host side 110 starts to transmit user data "DAT" 460 after receiving an acknowledgement (ACK) 430 from the controller 130. The host side 110 transmitting the SOB 410 that is utilized by the controller 130 to split a data stream correctly before the start of user data transmission. The host write command "CMD" 420 and the user data "DAT" 460 may also be referred to as valid packets. Those artisans understood that valid packets further include host administrative commands, other host I/O commands, and parameters carrying information that can be used by the Protocol Layer. The time periods for transmitting valid packets and associated necessary control symbols (such as the boundary-lock pattern, the synchronization pattern SYN, etc.) are referred to as valid-packet transmission periods in time. The time periods between the transmissions of the CMD 420 and the following SOB 410 are referred to as idle periods $t_{IDLE}$ in time. The host side 110 may repeatedly transmit UFS FILLER "FIL" 450 to the device side during the idle periods $t_{IDLE}$ that waits for ACKs 430 sent by the device side. Details of the UFS HOB and the UFS FILLER may refer to Table 1:

TABLE 1

| Input | | RD = -1 | RD = +1 | |
|---|---|---|---|---|
| Symbol | HGF EDCBA | abcdei fghj | abcdei fghj | Name |
| K.28.1 | 001 11100 | 001111 1001 | 110000 0110 | FILLER |
| K.28.5 | 101 11100 | 001111 1010 | 110000 0101 | MARKER0 |

In the environment of 128b/130b SerDes, the PHY circuits not only tracks the boundary-lock pattern during valid-packet transmission periods in time but also tracks a special symbol, such as the PCI-E Fast Training Sequence (FTS, also called K28.1 symbol). Details of the PCI-E comma character and the PCI-E FTS may refer to Table 2:

TABLE 2

| Encoding | Symbol | Name | Description |
|---|---|---|---|
| K28.1 | FTS | Fast Training Sequence | Used within an Ordered Set to exit from L0s to L0 |
| K28.5 | COM | Comma | Used for Lane and Link initialization and management |

Those artisans realize that the FTS is inserted before valid data. Although the host side 110 prolongs the transmission periodicity of the synchronization patterns, the PHY 170 would fix data split errors as earlier as possible by tracking more symbols.

Figure 5A:
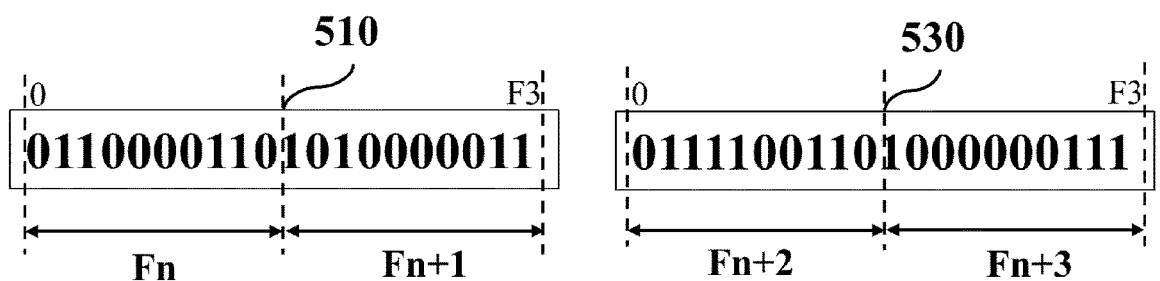
FIGS. 5A and 5B are schematic diagrams showing data segmentations according to embodiments of the invention.
Figure 5B:
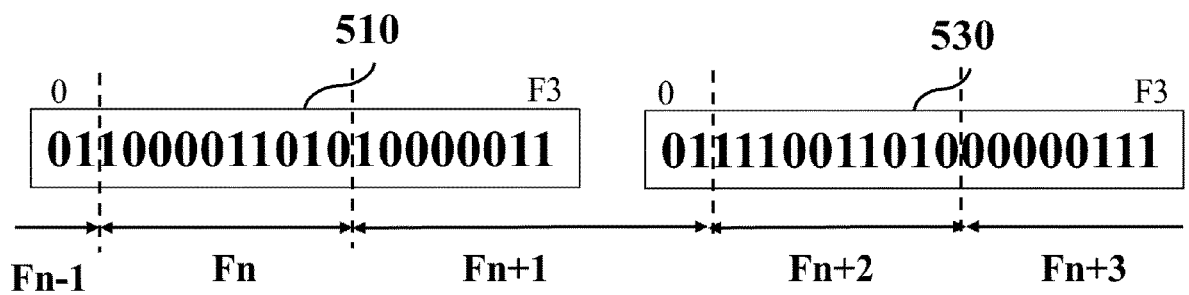

Refer to FIG. 1. The PHY 170 includes the host I/F 171 described above that receives host commands, parameters, user data and so on from the host side 110. Taking the 8b/10 SerDes environment as an example, the host commands, parameters and user data sent by the host side 110 are encoded in 10-bit units. The PHY 170 additionally includes a data register 173, a boundary detector 170, a stream splitter 175, an offset register 176 and a decoder 177. The data register 173 may store 20-bit of data received through the host I/F 171. The offset register 176 records a boundary between segments (may be also referred to as a starting address for splitting). The stream splitter 173 divides the data bits of the data register 173 into one or more segments according to the value of the offset register 176 and outputs the divided one(s) to the decoder 177. FIGS. 5A and 5B shows data-segment divisions as the offset register storing "0" and "2", respectively, according to embodiments of the invention. The data register 173 stores 20-bit of data 510 at the time point t1 and then stores the following 20-bit of data 530 at the time point t2.

Refer to FIG. 5A. For example, when the offset register 176 records "0", at the time point t1, the stream splitter 175 may collect the $0^{th}$ to the $9^{th}$ bits of data 510 as the segment Fn and collect the $10^{th}$ to the $19^{th}$ bits of data 510 as the segment Fn+1, and output the two segments of data to the decoder 177. At the time point t2, the stream splitter 175 may collect the $0^{th}$ to the $9^{th}$ bits of data 530 as the segment Fn+2 and collect the $10^{th}$ to the $19^{th}$ bits of data 530 as the segment Fn+3, and output the two segments of data to the decoder 177.

Refer to FIG. 5B. For example, when the offset register 176 records "2", at the time point t1, the stream splitter 175 may collect the $2^{th}$ to the $11^{th}$ bits of data 510 as the segment Fn and output the segment of data to the decoder 177. Additionally, the $12^{th}$ to the $19^{th}$ bits of data 510 may be reserved for later use. At the time point t2, the stream splitter 175 may combine the reserved bits into the $0^{th}$ to the $1^{st}$ bits of data 530 as the segment Fn+1, collet the $2^{nd}$ to the $11^{th}$ bits of data 530 as the segment Fn+2 and output the two segments to the decoder 177. Additionally, the $12^{th}$ to the $19^{th}$ bits of data 530 may be reserved for later use.

According to different SerDes environment settings, the decoder 177 may be an 8b/10 converter, a 64b/66b converter or a 128b/130b converter. The decoder 177 includes a mapping table for converting the input data bits into a code represented by less bits, for example, mapping each input 10-, 66- and 130-bit of data into 8-, 64-, and 128-bit codes, respectively. If there are any input data bits that cannot be converted into a code according to the mapping table, the decoder 177 determines that the input data bits are error bits, and may output a decode error message to the boundary detector 174. Otherwise, the decoder 177 may output a decode success message to the boundary detector 174. For example, in the 8b/10b SerDes environment, 10 bits can represent $2^{10}=1024$ states, but the mapping table contains $2^8=256$ mappings only. Thus, if the decoder 177 fails to convert input data bits into a code, it means that the raw data is altered during transmission.

Refer to FIG. 1. The boundary detector 174 has capacity for searching the boundary-lock pattern (such as the UFS HOB or the PCI-E comma character) and the predefined special symbol (such as the UFS FILLER or the PCI-E FTS). It is to be understood that the predefined special symbol is not originally used in the specification to determine the boundaries of each segment, but has other uses. The boundary detector 174 repeatedly detects the content of the data register 173. Once detecting that the boundary-lock pattern or the predefined special symbol is stored in the data register 173, the boundary detector 174 outputs a starting address that the detected boundary-lock pattern or the predefined special symbol is stored in the data register 173 to the offset register 176, so that the value of the offset register 176 is updated with the detected starting address. Thereafter, the stream splitter 175 divides data bits of the data register 173 into segment(s) according to the new value stored in the offset register 176.

Figure 6:
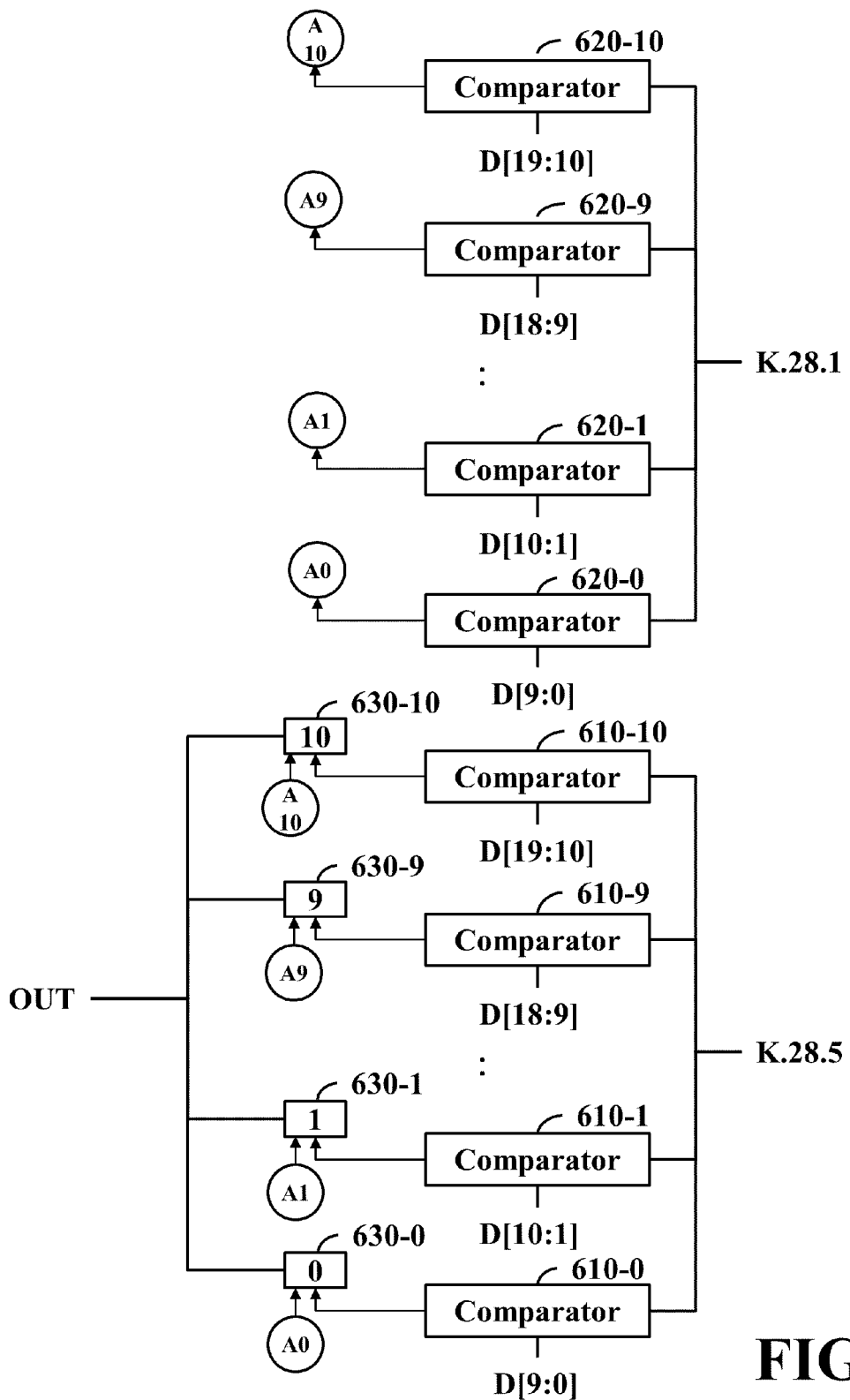
FIGS. 6 to 9 are block diagrams of boundary detectors according to embodiments of the invention.

Refer to FIG. 6. In some embodiments of the 8b/10b SerDes environment, for the UFS HOB (K.28.5), the boundary detector 174 contains 11 output circuits 630-0 to 630-10 coupled to the offset register 176 and being driven to output "0" to "10" to the offset register 176, respectively. The boundary detector 174 contains 11 comparators 610-0 to 610-10 for detecting all possible sequences of consecutive 10 bits of data in the data register 173. For example, the comparator 610-0 detects the $0^{th}$ to the $9^{th}$ bits of data D[9:0] in the data register 173, the comparator 610-1 detects $1^{st}$ to the $10^{th}$ bits of data D[10:1] in the data register 173, and so on. Each comparator is coupled to one corresponding output circuit and the output value of the coupled output circuit corresponds to the starting address of the input consecutive 10 bits of data in the data register 173. For example, the comparator 610-0 is coupled to the output circuit 630-0 capable of outputting "0", the comparator 610-1 is coupled to the output circuit 630-1 capable of outputting "1", and so on. Each of the comparators 610-0 to 610-10 compares the input consecutive 10 bits of data with the UFS HOB. If the input consecutive 10 bits of data matches the UFS HOB, then the comparator outputs a signal to drive the coupled output circuit to output the designated value (that is, the starting address of the UFS HOB in the data register 173) to the offset register 176. Otherwise, the comparator does not output any signal. Additionally, for the UFS FILLER (K.28.1), the boundary detector 174 further contains 11 comparators 620-0 to 620-10 for detecting all possible sequences of consecutive 10 bits of data in the data register 173. Each comparator is coupled to one corresponding output circuit and the output value of the coupled output circuit corresponds to the starting address of the input consecutive 10 bits of data in the data register 173. For example, the comparator 620-0 is coupled to the output circuit 630-0 capable of outputting "0", the comparator 620-1 is coupled to the output circuit 630-1 capable of outputting "1", and so on. Each of the comparators 620-0 to 620-10 compares the input consecutive 10 bits of data with the UFS FILLER. If the input consecutive 10 bits of data matches the UFS FILLER, then the comparator outputs a signal to drive the coupled output circuit to output the designated value (that is, the starting address of the UFS FILLER in the data register 173) to the offset register 176. Otherwise, the comparator does not output any signal.

Figure 7:
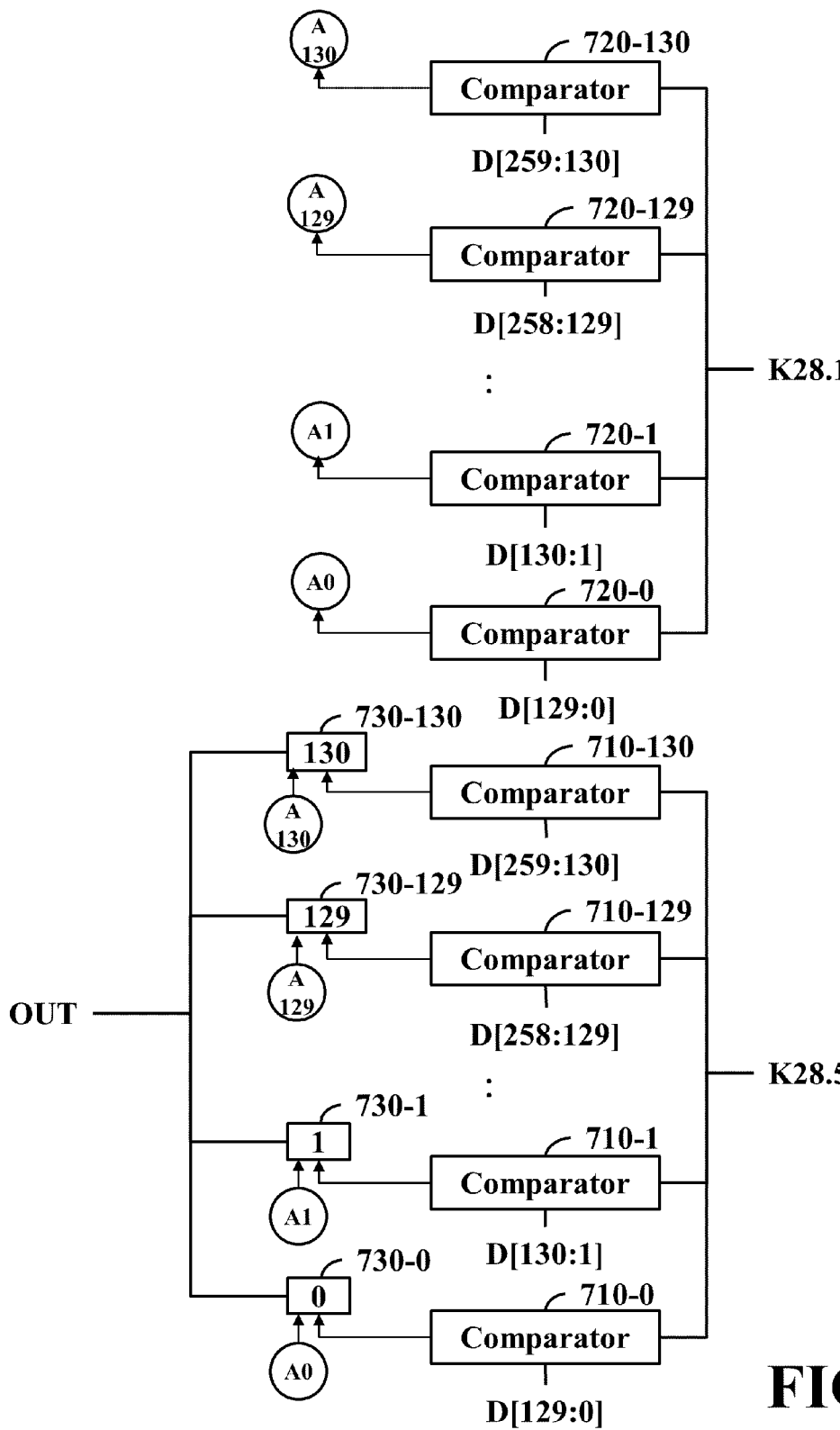

Refer to FIG. 7. In some embodiments of the 128b/130b SerDes environment, the data register 173 stores 260 bits of data. For the PCI-E comma character (K28.5), the boundary detector 174 contains 131 output circuits 730-0 to 730-130 coupled to the offset register 176 and being driven to output "0" to "130" to the offset register 176, respectively. The boundary detector 174 contains 131 comparators 710-0 to 710-130 for detecting all possible sequences of consecutive 130 bits of data in the data register 173. For example, the comparator 710-0 detects the $0^{th}$ to the $129^{th}$ bits of data D[129:0] in the data register 173, the comparator 710-1 detects $1^{st}$ to the $130^{th}$ bits of data D[130:1] in the data register 173, and so on. Each comparator is coupled to one corresponding output circuit and the output value of the coupled output circuit corresponds to the starting address of the input consecutive 130 bits of data in the data register 173. For example, the comparator 710-0 is coupled to the output circuit 730-0 capable of outputting "0", the comparator 710-1 is coupled to the output circuit 730-1 capable of outputting "1", and so on. Each of the comparators 710-0 to 710-130 compares the input consecutive 130 bits of data with the PCI-E comma character. If the input consecutive 130 bits of data matches the PCI-E comma character, then the comparator outputs a signal to drive the coupled output circuit to output the designated value (that is, the starting address of the PCI-E comma character in the data register 173) to the offset register 176. Otherwise, the comparator does not output any signal. Additionally, for the PCI-E FTS (K28.1), the boundary detector 174 further contains 131 comparators 720-0 to 720-130 for detecting all possible sequences of consecutive 130 bits of data in the data register 173. Each comparator is coupled to one corresponding output circuit and the output value of the coupled output circuit corresponds to the starting address of the input consecutive 130 bits of data in the data register 173. For example, the comparator 720-0 is coupled to the output circuit 730-0 capable of outputting "0", the comparator 720-1 is coupled to the output circuit 730-1 capable of outputting "1", and so on. Each of the comparators 720-0 to 720-130 compares the input consecutive 130 bits of data with the PCI-E FTS. If the input consecutive 130 bits of data matches the PCI-E FTS, then the comparator outputs a signal to drive the coupled output circuit to output the designated value (that is, the starting address of the PCI-E FTS in the data register 173) to the offset register 176. Otherwise, the comparator does not output any signal.

Figure 8:
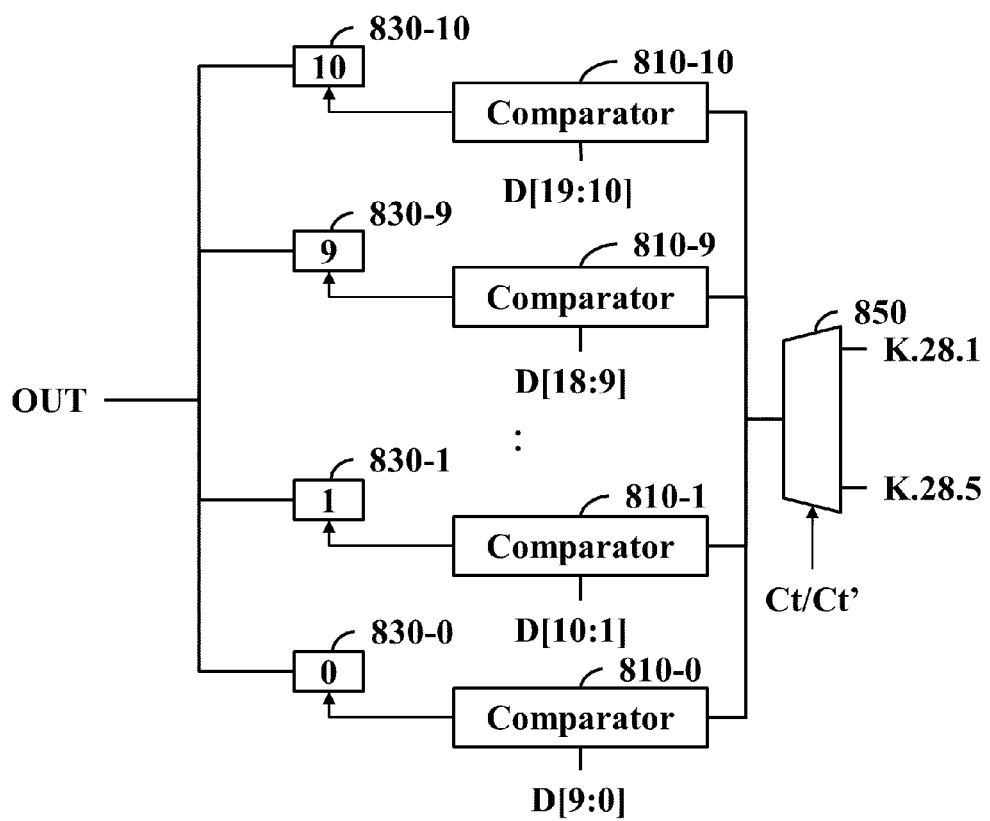

Refer to FIG. 8. In some embodiments of the 8b/10b SerDes environment, the boundary detector 174 includes a multiplexer (MUX) 850 whose two input terminals are fed in the UFS HOB and the UFS FILLER, respectively. The MUX 850 outputs the UFS HOB to all comparators 810-0 to 810-10 in response to a control signal Ct corresponding to a decode success message from the decoder 177 and outputs the UFS FILLER to all comparators 810-0 to 810-10 in response to a control signal Ct' corresponding to a decode error message from the decoder 177. The boundary detector 174 contains 11 output circuits 830-0 to 830-10 and their couplings and functions are similar with that of the output circuits 630-0 to 630-10 as shown in FIG. 6. The boundary detector 174 contains 11 comparators 810-0 to 810-10 for detecting all possible sequences of consecutive 10 bits of data in the data register 173. Each comparator is coupled to one corresponding output circuit and the output value of the coupled output circuit corresponds to the starting address of the input consecutive 10 bits of data in the data register 173. Each of the comparators 810-0 to 810-10 compares the input consecutive 10 bits of data with the code input from the MUX 850. If the two matches, then the comparator outputs a signal to drive the coupled output circuit to output the designated value (that is, the starting address of the UFS HOB or the UFS FILLER in the data register 173) to the offset register 176. Otherwise, the comparator does not output any signal. Comparing with FIG. 6, the circuits as shown in FIG. 8 reduces the comparators by half.

Figure 9:
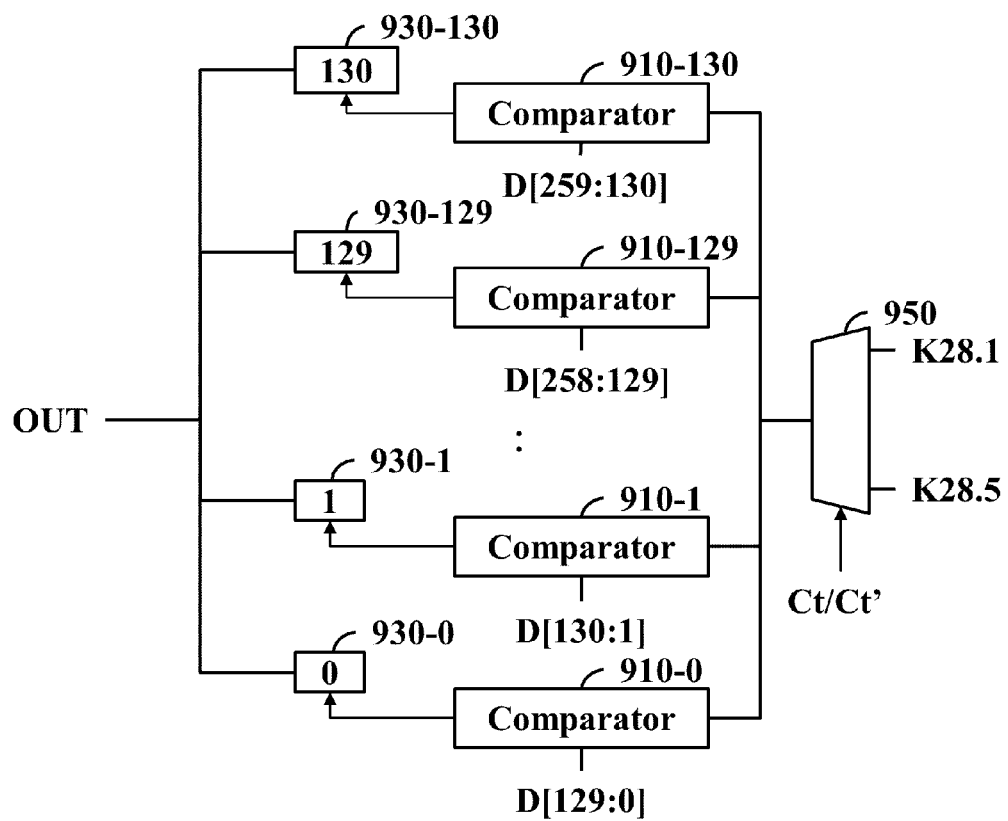

Refer to FIG. 9. In some embodiments of the 128b/130b SerDes environment, the boundary detector 174 includes a MUX 950 whose two input terminals are fed in the PCI-E comma character and the PCI-E FTS, respectively. The MUX 950 outputs the PCI-E comma character to all comparators 910-0 to 910-130 in response to a control signal Ct corresponding to a decode success message from the decoder 177 and outputs the PCI-E FTS to all comparators 910-0 to 910-130 in response to a control signal Ct' corresponding to a decode error message from the decoder 177. The boundary detector 174 contains 131 output circuits 930-0 to 930-130 and their couplings and functions are similar with that of the output circuits 730-0 to 730-130 as shown in FIG. 7. The boundary detector 174 contains 131 comparators 910-0 to 910-130 for detecting all possible sequences of consecutive 130 bits of data in the data register 173. Each comparator is coupled to one corresponding output circuit and the output value of the coupled output circuit corresponds to the starting address of the input consecutive 130 bits of data in the data register 173. Each of the comparators 910-0 to 910-130 compares the input consecutive 130 bits of data with the code input from the MUX 950. If the two matches, then the comparator outputs a signal to drive the coupled output circuit to output the designated value (that is, the starting address of the PCI-E comma character or the PCI-E FTS in the data register 173) to the offset register 176. Otherwise, the comparator does not output any signal. Comparing with FIG. 7, the circuits as shown in FIG. 9 reduces the comparators by half.

Figure 10:
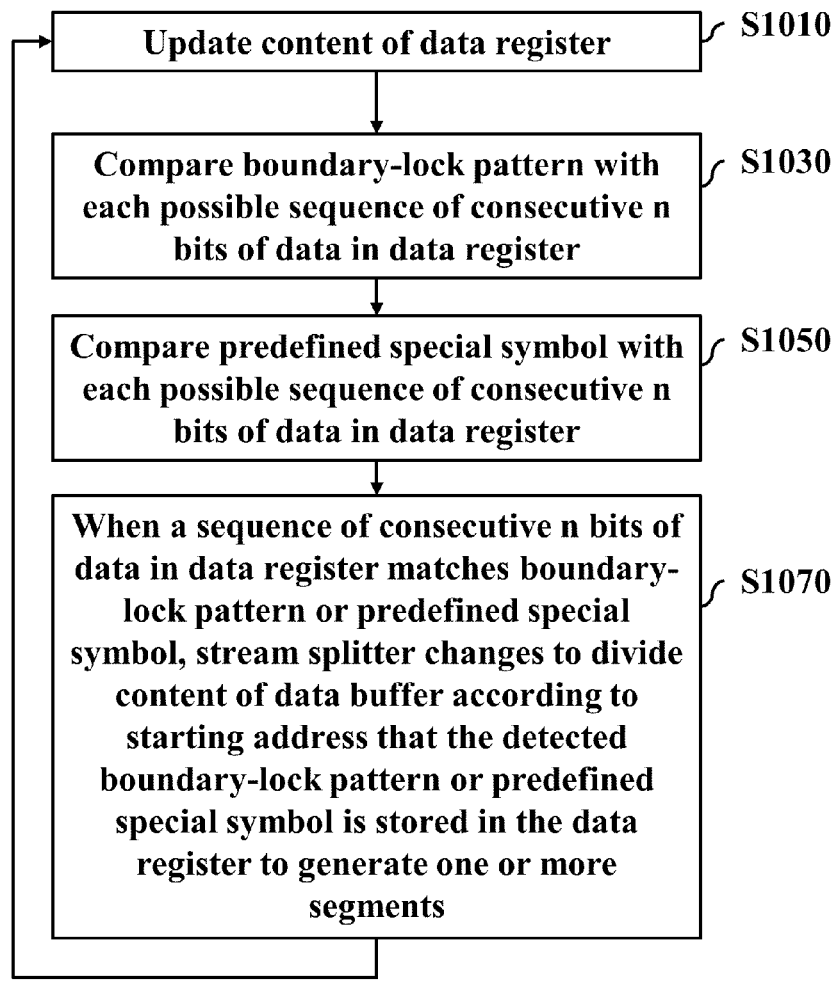
FIGS. 10 to 11 are flowcharts illustrating methods for splitting a data stream according to embodiments of the invention.

In some embodiments, refer to the method for segmenting a data stream, performed by the PHY 170, as shown in FIG. 10.

Step S1010: The process repeatedly updates the content of the data register 173 for storing data received from the host side 110.

Step S1030: Each time the content of the data register is updated, the boundary-lock pattern is compared with each possible sequence of consecutive n bits of data in the data register 173.

Step S1050: Each time the content of the data register is updated, the predefined special symbol is compared with each possible sequence of consecutive n bits of data in the data register 173.

Step S1070: When a sequence of consecutive n bits of data in the data register 173 matches the boundary-lock pattern or the predefined special symbol, it is changed to divide the content of the data buffer 137 according to the starting address that the detected boundary-lock pattern or predefined special symbol is stored in the data register 173 to generate one or more segments.

Figure 11:
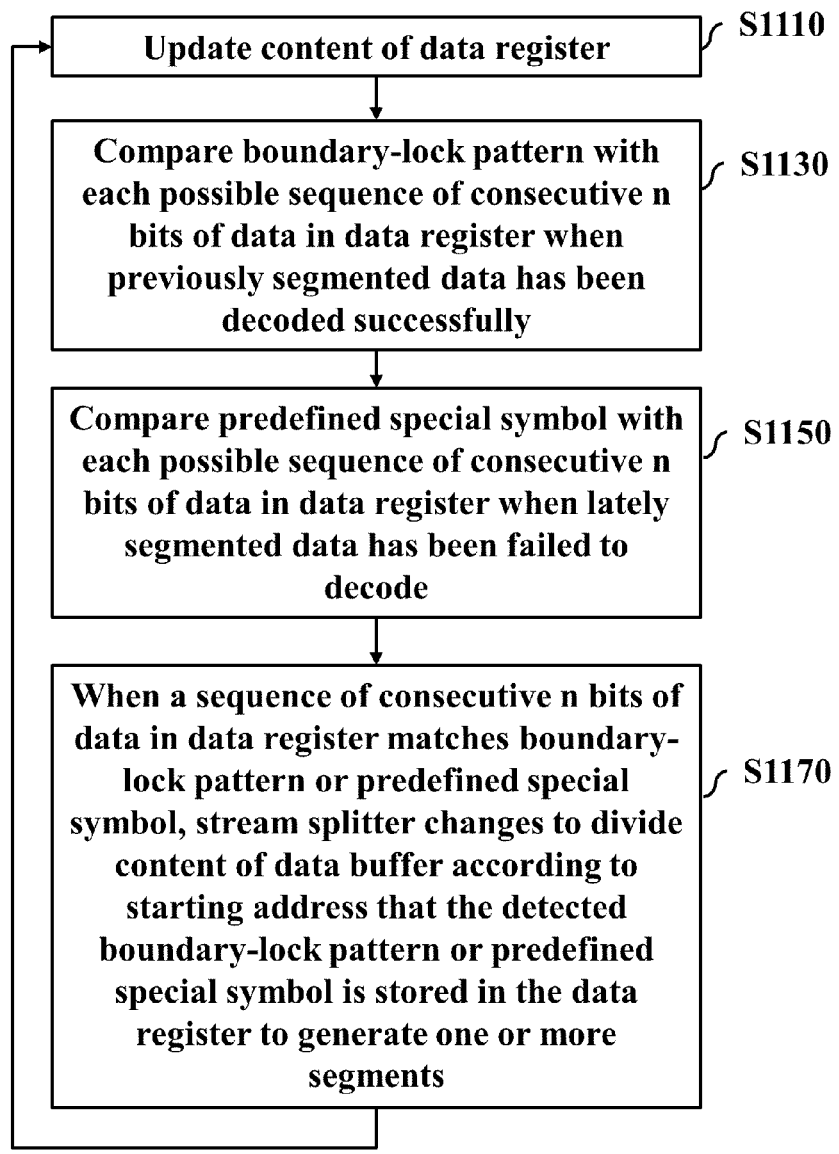

In alternative embodiments, refer to the method for segmenting a data stream, performed by the PHY 170, as shown in FIG. 11.

Step S1110: The process repeatedly updates the content of the data register 173 for storing data received from the host side 110.

Step S1130: Each time the content of the data register is updated and lately segmented data has been decoded successfully, the boundary-lock pattern is compared with each possible sequence of consecutive n bits of data in the data register 173.

Step S1150: Each time the content of the data register is updated and lately segmented data has been failed to decode, the predefined special symbol is compared with each possible sequence of consecutive n bits of data in the data register 173.

Step S1170: When a sequence of consecutive n bits of data in the data register 173 matches the boundary-lock pattern or the predefined special symbol, it is changed to divide the content of the data buffer 137 according to the starting address that the detected boundary-lock pattern or predefined special symbol is stored in the data register 173 to generate one or more segments.

In some use cases by using the method of FIG. 10 or FIG. 11, n is set to "10", the PHY 170 is configured to the 8b/10b SerDes environment, the boundary-lock pattern is set to the K.28.5 symbol and the special symbol is set to the K.28.1 symbol that is sent by the host side 110 during the idle periods.

In alternative use cases by using the method of FIG. 10 or FIG. 11, n is set to "130", the PHY 170 is configured to the 128b/130b SerDes environment, the boundary-lock pattern is set to the K28.5 symbol and the special symbol is set to the K28.1 symbol that is inserted by the host side 110 before valid data.

In general, embodiment of the invention is applied to the PHY 170 that is configured to an n1-b/n2-b SerDes environment, where n1 and n2 are positive integers and n1 is smaller than n2.

Although the embodiments describe the 8b/10b and 128b/130b SerDes environment as examples, those artisans may apply the introduced apparatuses and the methods to other SerDes environments, such as the 64b/66b SerDes environment, with relevant modifications.

Although the embodiment has been described as having specific elements in FIGS. 1-2 and 6-9, it should be noted that additional elements may be included to achieve better performance without departing from the spirit of the invention. Each element of FIGS. 1-2 and 6-9 is composed of various circuits and arranged to operably perform the aforementioned operations. While the process flows described in FIGS. 10-11 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for segmenting a data stream, installed in a physical layer, comprising:
   a host interface, coupled to a host side;
   a data register, coupled to the host interface, arranged to operably store data received from the host side through the host interface; and
   a boundary detector, coupled to the data register, arranged to operably detect content of the data register; and output a starting address that a special symbol is stored in the data register to an offset register to update a value stored in the offset register when the data register comprises the special symbol, thereby enabling a stream splitter to divide data bits of the data register according to an updated value of the offset register,
   wherein the special symbol is not originally used to determine boundaries of each segment,
   wherein the physical layer is configured to an 8b/10b Serializer/Deserializer environment and the special symbol is a K.28.1 symbol that is sent by the host side during idle periods, wherein the boundary detector comprises:
- a plurality of output circuits, coupled to the offset register, each arranged to operably output a specific value to the offset register when being driven; and
- a plurality of comparators, arranged to operably detect all possible sequences of consecutive 10 bits of data in the data register, wherein each comparator is coupled to one corresponding output circuit, and is arranged to operably drive a coupled output circuit when input consecutive 10 bits of data output from the data register matches the K.28.1 symbol.

2. The apparatus of claim 1, comprising:
a decoder, coupled to the boundary detector, comprising a mapping table for converting 10 bits of data into a code represented by 8 bits, and is arranged to operably generate a decode error message and output the decode error message to the boundary detector when segmented 10 bits of data cannot be converted into any code according to the mapping table, whereby enabling the boundary detector to compare all possible sequences of consecutive 10 bits of data in the data register with the K.28.1 symbol.

3. An apparatus for segmenting a data stream, installed in a physical layer, comprising:
- a host interface, coupled to a host side;
- a data register, coupled to the host interface, arranged to operably store data received from the host side through the host interface; and
- a boundary detector, coupled to the data register, arranged to operably detect content of the data register; and output a starting address that a special symbol is stored in the data register to an offset register to update a value stored in the offset register when the data register comprises the special symbol, thereby enabling a stream splitter to divide data bits of the data register according to an updated value of the offset register,
wherein the special symbol is not originally used to determine boundaries of each segment,
wherein the physical layer is configured to an 128b/130b Serializer/Deserializer environment and the special symbol is a K28.1 symbol that is inserted by the host side before valid data,
wherein the boundary detector comprises:
- a plurality of output circuits, coupled to the offset register, each arranged to operably output a specific value to the offset register when being driven; and
- a plurality of comparators, arranged to operably detect all possible sequences of consecutive 130 bits of data in the data register, wherein each comparator is coupled to one corresponding output circuit, and is arranged to operably drive a coupled output circuit when input consecutive 130 bits of data output from the data register matches the K28.1 symbol.

4. The apparatus of claim 3, comprising:
a decoder, coupled to the boundary detector, comprising a mapping table for converting 130 bits of data into a code represented by 128 bits, and is arranged to operably generate a decode error message and output the decode error message to the boundary detector when segmented 130 bits of data cannot be converted into any code according to the mapping table, whereby enabling the boundary detector to compare all possible sequences of consecutive 130 bits of data in the data register with the K28.1 symbol.

* * * * *